US012597926B2

(12) United States Patent
Nakamura

(10) Patent No.: US 12,597,926 B2
(45) Date of Patent: Apr. 7, 2026

(54) VEHICLE STEERING SYSTEM

(71) Applicant: HONDA MOTOR CO., LTD., Tokyo (JP)

(72) Inventor: Kotaro Nakamura, Tokyo (JP)

(73) Assignee: HONDA MOTOR CO., LTD., Tokyo (JP)

( * ) Notice: Subject to any disclaimer, the term of this patent is extended or adjusted under 35 U.S.C. 154(b) by 145 days.

(21) Appl. No.: 18/587,422

(22) Filed: Feb. 26, 2024

(65) Prior Publication Data

US 2024/0317296 A1 Sep. 26, 2024

(30) Foreign Application Priority Data

Mar. 20, 2023 (JP) ................................. 2023-043762

(51) Int. Cl.
| | |
|---|---|
| *H03K 17/96* | (2006.01) |
| *B60K 35/10* | (2024.01) |
| *B62D 1/04* | (2006.01) |
| *G01D 5/241* | (2006.01) |

(52) U.S. Cl.
CPC ........... *H03K 17/962* (2013.01); *B60K 35/10* (2024.01); *B62D 1/046* (2013.01); *G01D 5/241* (2013.01)

(58) Field of Classification Search
CPC ........ G01R 27/00; G01R 27/02; G01R 27/26; G01R 27/2605; G01D 5/00; G01D 5/12; G01D 5/14; G01D 5/24; G01D 5/241; H03K 17/00; H03K 17/94; H03K 17/96; H03K 17/962; B60K 35/00; B60K 35/10; B62D 1/00; B62D 1/02; B62D 1/04; B62D 1/046; B60W 10/00; B60W 10/20; B60W 50/00; B60W 50/08; B60W 50/14; B60W 50/146
USPC .................................. 324/600, 649, 658, 661
See application file for complete search history.

(56) References Cited

U.S. PATENT DOCUMENTS

| | | | | |
|---|---|---|---|---|
| 10,773,743 B2 * | 9/2020 | Park | .................... | B62D 15/025 |
| 11,150,113 B2 | 10/2021 | Kunieda et al. | | |
| 11,840,223 B2 * | 12/2023 | Yang | .................... | B60W 10/08 |

(Continued)

FOREIGN PATENT DOCUMENTS

| | | | | | |
|---|---|---|---|---|---|
| CN | 110603166 A | * | 12/2019 | ............ | B60W 50/16 |
| CN | 115771517 A | * | 3/2023 | ............ | B60W 50/14 |
| CN | 117922582 A | * | 4/2024 | ........ | B60W 60/0051 |

(Continued)

*Primary Examiner* — Hoai-An D. Nguyen
(74) *Attorney, Agent, or Firm* — Armstrong Teasdale LLP

(57) ABSTRACT

A vehicle steering system includes a steering operation member configured to receive a steering operation, a capacitive sensor provided in the steering operation member, a controller configured to determine that a driver is gripping the steering operation member in a case where capacitance of the capacitive sensor is equal to or more than a first threshold and determine that the driver is not gripping the steering operation member in a case where the capacitance of the capacitive sensor is less than the first threshold, and a notification device configured to give a notification in a case where the controller determines that the driver is not gripping the steering operation member. The notification device is configured to give the notification in a case where the capacitance of the capacitive sensor decreases after increasing to exceed the first threshold and then remains at the first threshold or more.

9 Claims, 8 Drawing Sheets

(56)          References Cited

U.S. PATENT DOCUMENTS 12,083,881 B2 *   9/2024   Tsukada .............. G07C 5/0808

FOREIGN PATENT DOCUMENTS

EP            4516610  A1 *   3/2025   ............. B62D 1/046
JP          2020082806  A      6/2020

* cited by examiner

VEHICLE STEERING SYSTEM

TECHNICAL FIELD

The present invention relates to a vehicle steering system.

BACKGROUND ART

In recent years, there has been an increase in efforts to give consideration to vulnerable people among transport participants and provide them with access to sustainable transport systems. To this end, research and development to further improve traffic safety and convenience through the development of driving assistance technologies is attracting attention. In particular, the development of a vehicle steering system is attracting attention as a development relating to the driving assistance technologies.

For example, a known vehicle steering system is configured to determine whether a driver is gripping a steering operation member (for example, a steering wheel) based on the capacitance of a capacitive sensor (see JP2020-82806A).

When a foreign object (for example, a wet towel) is put on the steering operation member in such a vehicle steering system, the capacitance of the capacitive sensor may change to the same extent as the time when the driver is gripping the steering operation member. In such a case, it is difficult to determine whether the foreign object is put on the steering operation member or the driver is gripping the steering operation member based only on the convergence value of the capacitance of the capacitive sensor. Accordingly, in a case where the foreign object is put on the steering operation member, it may be mistakenly determined that the driver is gripping the steering operation member even though the driver is not gripping the steering operation member, so that a notification may not be properly given to the driver.

SUMMARY OF THE INVENTION

In view of the above background, an object of the present invention is to properly give a notification to a driver in a case where a foreign object is put on a steering operation member, and to contribute to the development of a sustainable transportation system accordingly.

To achieve such an object, one aspect of the present invention provides a vehicle steering system (3), comprising: a steering operation member (22) configured to receive a steering operation of a vehicle (1) by a driver; a capacitive sensor (53 to 58) provided in the steering operation member and configured such that capacitance of the capacitive sensor changes as the driver grips the steering operation member; a controller (15) configured to determine that the driver is gripping the steering operation member in a case where the capacitance of the capacitive sensor is equal to or more than a first threshold and determine that the driver is not gripping the steering operation member in a case where the capacitance of the capacitive sensor is less than the first threshold; and a notification device (8) configured to give a notification to the driver in a case where the controller determines that the driver is not gripping the steering operation member, wherein the notification device is configured to give the notification to the driver in a case where the capacitance of the capacitive sensor decreases after increasing to exceed the first threshold and then remains at the first threshold or more.

In a case where the driver grips the steering operation member, only the driver's hand approaches and contacts with the steering operation member. Accordingly, the capacitance of the capacitive sensor simply increases and then settles down to a certain value. In contrast, in a case where a foreign object is put on the steering operation member, both the occupant's hand and the foreign object approach the steering operation member, and then only the occupant's hand moves away from the steering operation member while leaving the foreign object on the steering operation member. Accordingly, the capacitance of the capacitive sensor decreases after increasing and then settles down to a certain value. As such, the notification device gives the notification to the driver in a case where the capacitance of the capacitive sensor decreases after increasing to exceed the first threshold and then remains at the first threshold or more (that is, in a case where the capacitance of the capacitive sensor decreases after increasing and then settles down to a certain value). Accordingly, in a case where the foreign object is put on the steering operation member, the notification can be properly given to the driver. Accordingly, it is possible to contribute to the development of a sustainable transportation system.

In the above aspect, preferably, the notification device is configured to give the notification to the driver in a case where the capacitance of the capacitive sensor falls below a second threshold after increasing to the second threshold or more and then remains at the first threshold or more, the second threshold being greater than the first threshold.

According to this aspect, by setting the second threshold to a value that is sufficiently larger than the capacitance of the capacitive sensor when only the driver's hand approaches the steering operation member, it is possible to prevent the notification from being given to the driver even though the driver is gripping the steering operation member normally.

In the above aspect, preferably, the notification device is configured to give the notification to the driver in a case where the capacitance of the capacitive sensor decreases by a third threshold or more after increasing to exceed the first threshold and then remains at the first threshold or more.

According to this aspect, by setting the third threshold to a value that is sufficiently larger than the amount by which the capacitance of the capacitive sensor decreases when the driver grips the steering operation member again or slightly lifts his/her hand from the steering operation member, it is possible to prevent the notification from being given to the driver even though the driver is gripping the steering operation member normally.

In the above aspect, preferably, the notification device is configured to give the notification to the driver in a case where the capacitance of the capacitive sensor decreases after increasing to exceed the first threshold and then remains at the first threshold or more for a prescribed period.

According to this aspect, it is possible to give the notification to the driver after confirming that the capacitance of the capacitive sensor settles down to a value equal to or more than the first threshold.

In the above aspect, preferably, the notification device is configured to give the notification to the driver in a case where the capacitance of the capacitive sensor decreases after increasing to exceed the first threshold and then remains at the first threshold or more for a prescribed period, and a total changing amount of the capacitance of the capacitive sensor in the prescribed period is less than a fourth threshold.

In a case where the foreign object is put on the steering operation member, it is usual that the position of the foreign object does not change. Accordingly, the capacitance of the capacitive sensor remains stable after settling down to a certain value. According to the above aspect, the notification is given to the driver in a case where the total changing amount of the capacitance of the capacitive sensor in the prescribed period is less than the fourth threshold (that is, in a case where the capacitance of the capacitive sensor remains stable). Accordingly, in a case where the foreign object is put on the steering operation member, the notification can be reliably given to the driver.

In the above aspect, preferably, the notification device does not give the notification to the driver in a case where the capacitance of the capacitive sensor decreases after increasing to exceed the first threshold and then remains at the first threshold or more for a prescribed period, and a total changing amount of the capacitance of the capacitive sensor in the prescribed period is a fourth threshold or more.

In a case where the driver grips the steering operation member, it is usual that the position of the driver's hand changes slightly as the driver grips the steering operation member again or changes the hand to grip the steering operation member. Accordingly, the capacitance of the capacitive sensor increases or decreases slightly even after settling down to a certain value. According to the above aspect, in a case where the total changing amount of the capacitance of the capacitive sensor in the prescribed period is the fourth threshold or more, the notification is not given to the driver. Accordingly, it is possible to prevent the notification from being given to the driver even though the driver is gripping the steering operation member normally.

In the above aspect, preferably, the notification device is configured to give the notification that prompts the driver to grip the steering operation member in a case where the capacitance of the capacitive sensor decreases after increasing to exceed the first threshold and then remains at the first threshold or more.

According to this aspect, in a case where the foreign object is put on the steering operation member, it is possible to prompt the driver to grip the steering operation member.

In the above aspect, preferably, the notification device is configured to end the notification that prompts the driver to grip the steering operation member in a case where the capacitance of the capacitive sensor falls below the first threshold and then increases to the first threshold or more after starting the notification that prompts the driver to grip the steering operation member.

According to this aspect, it is possible to end the notification that prompts the driver to grip the steering operation member after confirming that the driver is gripping the steering operation member.

In the above aspect, preferably, the controller is configured to update the first threshold based on the capacitance of the capacitive sensor at a time when the controller determines that the driver is gripping the steering operation member.

According to this aspect, the first threshold can be set to an appropriate value depending on the characteristics (for example, the moisture and size) of the driver's hand.

Thus, according to the above aspects, it is possible to properly give a notification to a driver in a case where a foreign object is put on a steering operation member.

BRIEF DESCRIPTION OF THE DRAWING(S)

FIGS. 6A and 6B are graphs each illustrating the change in the capacitance of a capacitive sensor according to the second embodiment of the present invention;

DETAILED DESCRIPTION OF THE INVENTION

The First Embodiment

Hereinafter, the first embodiment of the present invention will be described with reference to FIGS. 1 to 4.
<The Vehicle 1>

Figure 1:
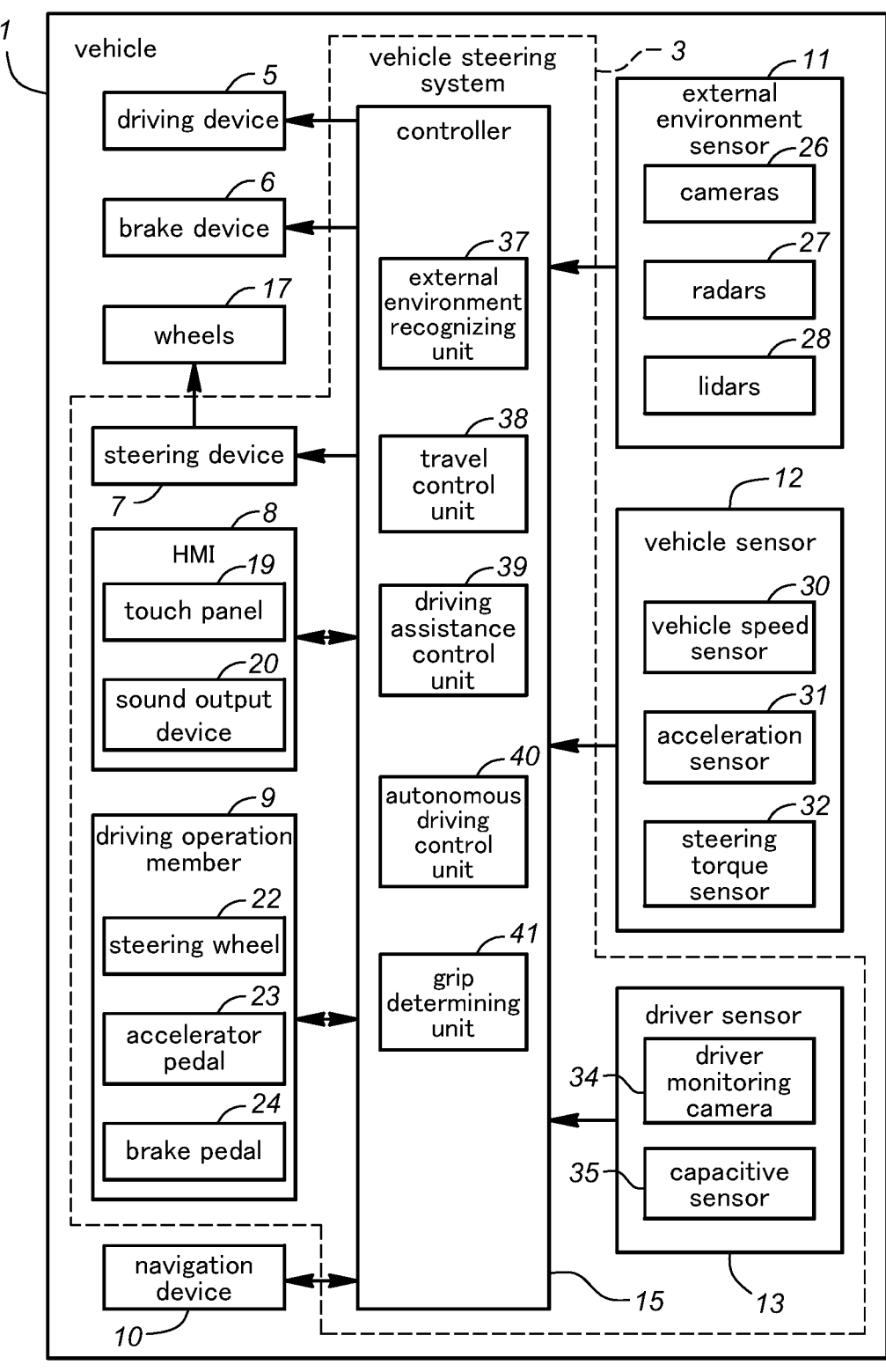
FIG. 1 is a functional block diagram showing a vehicle to which a vehicle steering system according to the first embodiment of the present invention is applied.

First, with reference to FIG. 1, a vehicle 1 to which a vehicle steering system 3 according to the first embodiment of the present invention is applied will be described. For example, the vehicle 1 is an automobile. In another embodiment, the vehicle 1 may be a vehicle (for example, a motorcycle) other than an automobile.

The vehicle 1 includes a driving device 5, a brake device 6, a steering device 7, a Human Machine Interface 8 (HMI: an example of a notification device), a driving operation member 9, a navigation device 10, an external environment sensor 11, a vehicle sensor 12, a driver sensor 13, and a controller 15. Hereinafter, the components of the vehicle 1 will be described in order.

The driving device 5 is a device that applies a driving force to the vehicle 1. The driving device 5 includes a drive source that generates a driving force for driving the vehicle 1. For example, the drive source is configured by an internal combustion engine and/or an electric motor.

The brake device 6 is a device that applies a braking force to the vehicle 1. For example, the brake device 6 includes a brake caliper that presses a pad against a brake rotor, and an electric cylinder that supplies hydraulic pressure to the brake caliper.

The steering device 7 is a device that changes a turning angle of wheels 17 by turning the wheels 17. For example, the steering device 7 includes a rack and pinion mechanism connected to the wheels 17 and an electric motor that drives the rack and pinion mechanism.

The HMI 8 is a device that presents information to an occupant (for example, the driver) of the vehicle 1 and receives information input by the occupant. The HMI 8 includes a touch panel 19 and a sound output device 20. The touch panel 19 displays various screens to the occupant and receives input operations on the various screens by the occupant. The sound output device 20 outputs audio guidance, warning sounds, or the like.

The driving operation member 9 is a device that receives a driving operation by the driver. The driving operation member 9 includes a steering wheel 22 (an example of a steering operation member) that receives the steering operation of the vehicle 1 by the driver, an accelerator pedal 23 that receives an acceleration operation of the vehicle 1 by the driver, and a brake pedal 24 that receives a brake operation of the vehicle 1 by the driver.

The navigation device 10 is a device that provides route guidance to the destination of the vehicle 1. The navigation device 10 identifies the current position of the vehicle 1 based on GNSS signals received from artificial satellites. The navigation device 10 sets a route to the destination of the vehicle 1 based on the current position of the vehicle 1 and the destination of the vehicle 1 input into the touch panel 19 by the occupant.

The external environment sensor 11 is a device that detects the state of the external environment of the vehicle 1. The external environment sensor 11 includes a plurality of cameras 26, a plurality of radars 27, and a plurality of lidars 28 (LiDAR). Each camera 26 captures an image of a target (surrounding vehicles such as a preceding vehicle, pedestrians, structures on a road, lane markings, or the like) existing around the vehicle 1. Each radar 27 detects the position of the target existing around the vehicle 1 by emitting radio waves such as millimeter waves around the vehicle 1 and capturing the reflected waves thereof. Each lidar 28 detects the position of the target existing around the vehicle 1 by irradiating light such as infrared rays around the vehicle 1 and capturing the reflected light thereof.

The vehicle sensor 12 is a sensor that detects various vehicle states. The vehicle sensor 12 includes a vehicle speed sensor 30 that detects the vehicle speed of the vehicle 1, an acceleration sensor 31 that detects the acceleration (lateral acceleration) of the vehicle 1 in the lateral direction, and a steering torque sensor 32 that detects the steering torque generated in response to the steering operation of the vehicle 1 by the driver.

The driver sensor 13 is a sensor that detects the state of the driver. The driver sensor 13 includes a driver monitoring camera 34 and a capacitive sensor 35. The driver monitoring camera 34 captures an image of the driver. The capacitive sensor 35 is provided in the steering wheel 22, and configured such that the capacitance of the capacitive sensor 35 changes as the driver grips the steering wheel 22. Only one capacitive sensor 35 may be provided, or a plurality of capacitive sensors 35 may be provided. The capacitive sensor 35 is formed of an electrode that can be capacitively coupled to an object approaching the steering wheel 22. As the driver's hand approaches the steering wheel 22, the distance between the driver's hand and the electrode becomes shorter, and thus the capacitance of the capacitive sensor 35 increases. The above-mentioned "capacitance of the capacitive sensor 35" may be the value of the capacitance of the capacitive sensor 35 itself, or may be an output value (output voltage) of the capacitive sensor 35 corresponding to the capacitance of the capacitive sensor 35.

The controller 15 constitutes the vehicle steering system 3 together with the steering device 7, the HMI 8, the driving operation member 9 (more specifically, the steering wheel 22), and the driver sensor 13 (more specifically, the capacitive sensor 35).

The controller 15 is an electronic control unit (ECU) consisting of a computer configured to perform various processes. The controller 15 includes an arithmetic processing unit (a processor such as CPU and MPU) and a storage device (memory such as ROM and RAM). The arithmetic processing unit reads necessary software from the storage device and executes prescribed arithmetic processing according to the read software. The controller 15 may be configured as one piece of hardware, or may be configured as a unit consisting of plural pieces of hardware. The controller 15 is connected to each component of the vehicle 1 via a communication network such as Controller Area Network (CAN), and controls each component of the vehicle 1.

The controller 15 includes, as functional components, an external environment recognizing unit 37, a travel control unit 38, a driving assistance control unit 39, an autonomous driving control unit 40, and a grip determining unit 41. At least some of the functional components of the controller 15 may be realized by hardware such as LSI, ASIC, and FPGA, or may be realized by a combination of software and hardware.

The external environment recognizing unit 37 recognizes the state of the external environment of the vehicle 1 based on the detection result of the external environment sensor 11. For example, the external environment recognizing unit 37 recognizes the target (surrounding vehicles such as a preceding vehicle, pedestrians, structures on a road, lane markings, or the like) existing around the vehicle 1 based on the detection result of the external environment sensor 11.

The travel control unit 38 controls the traveling of the vehicle 1 according to the driving operation on the driving operation member 9 by the driver. For example, the travel control unit 38 controls the steering device 7 to turn the vehicle 1 in response to the steering operation of the vehicle 1 on the steering wheel 22 by the driver. The travel control unit 38 controls the driving device 5 according to the acceleration operation of the vehicle 1 on the accelerator pedal 23 by the driver, and accelerates the vehicle 1. The travel control unit 38 controls the brake device 6 in response to the brake operation of the vehicle 1 on the brake pedal 24 by the driver, and decelerates the vehicle 1.

The driving assistance control unit 39 executes advanced driving assistance control (Advanced Driver Assistance Systems: ADAS) of the vehicle 1 based on the recognition result of the external environment recognizing unit 37. The advanced driving assistance control is the control equivalent to autonomous driving levels 1 to 2 of SAE. When the advanced driving assistance control is executed, the driver becomes the driving entity of the vehicle 1 and has the driving authority of the vehicle 1. Hereinafter, the advanced driving assistance control will be abbreviated as "driving assistance control".

The driving assistance control unit 39 is configured to execute following travel control (adaptive cruise control: ACC) as the driving assistance control. When executing ACC, the driving assistance control unit 39 controls the driving device 5 and the brake device 6 to cause the vehicle 1 to follow the preceding vehicle while maintaining a prescribed inter-vehicle distance.

The driving assistance control unit 39 is configured to execute lane keeping assistance control (Lane Keeping Assistance System: LKAS) as the driving assistance control. When executing LKAS, the driving assistance control unit 39 controls the steering wheel 22 and the steering device 7 to assist the steering operation of the vehicle 1 by the driver such that the vehicle 1 maintains the traveling position within a lane.

The driving assistance control unit 39 is configured to execute collision mitigation brake control (Collision Mitigation Brake System: CMBS) as the driving assistance control. When executing CMBS, the driving assistance control unit 39 controls the brake device 6 to mitigate the collision between the vehicle 1 and an object outside the vehicle.

The autonomous driving control unit 40 executes autonomous driving control (Autonomous Driving: AD) of the vehicle 1. The autonomous driving control is the control equivalent to autonomous driving level 3 or higher of SAE. When the autonomous driving control is executed, the autonomous driving control unit 40 becomes the driving entity of the vehicle 1 and has the driving authority of the vehicle 1. When executing autonomous driving control, the autonomous driving control unit 40 automatically controls the driving device 5, the brake device 6, and the steering device 7, and causes the vehicle 1 to travel autonomously.

The grip determining unit 41 determines whether the driver is gripping the steering wheel 22 based on the capacitance of the capacitive sensor 35. More specifically, the grip determining unit 41 determines that the driver is gripping the steering wheel 22 in a case where the capacitance of the capacitive sensor 35 is equal to or more than a first threshold TH1. By contrast, the grip determining unit 41 determines that the driver is not gripping the steering wheel 22 in a case where the capacitance of the capacitive sensor 35 is less than the first threshold TH1.

In the following, for convenience of explanation, the functional components of the controller 15 will be simply referred to as "the controller 15" without distinction.

<The Notification Giving Control>

Figure 2:
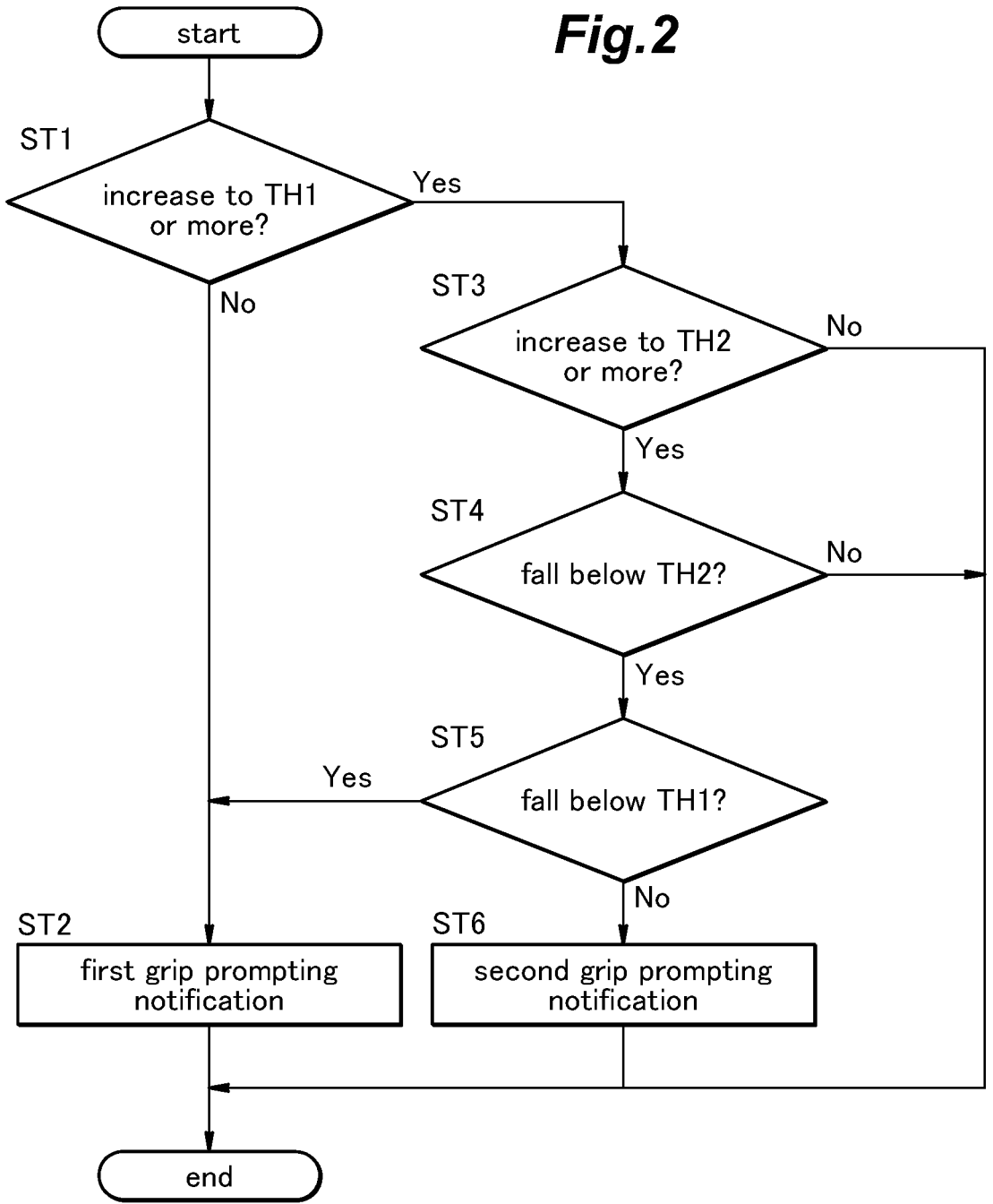
FIG. 2 is a flowchart showing notification giving control according to the first embodiment of the present invention.

Next, notification giving control for giving a notification (first or second grip prompting notification which will be described later) to the driver will be described with reference to FIG. 2. For example, the controller 15 may execute the notification giving control in a case where it becomes necessary to transfer the driving authority of the vehicle 1 to the driver (in a case where it becomes necessary to shift the autonomous driving level from 3 or higher to 2 or lower). In the following, it is assumed that the capacitance of the capacitive sensor 35 is less than the first threshold TH1 at the start of the notification giving control.

First, the controller 15 determines whether the capacitance of the capacitive sensor 35 increases to the first threshold TH1 or more (step ST1) after a prescribed time has elapsed from the start of the notification giving control.

In a case where the capacitance of the capacitive sensor 35 is less than the first threshold TH1 (step ST1: No), the controller 15 determines that the driver is not gripping the steering wheel 22, and causes the HMI 8 to give the first grip prompting notification to the driver (step ST2). The first grip prompting notification is a notification that prompts the driver to grip the steering wheel 22. For example, the touch panel 19 of the HMI 8 may display, as the first grip prompting notification, a message urging the driver to grip the steering wheel 22. For example, the sound output device 20 of the HMI 8 may output, as the first grip prompting notification, audio guidance or a warning sound that prompts the driver to grip the steering wheel 22.

In a case where the capacitance of the capacitive sensor 35 increases to the first threshold TH1 or more (step ST1: Yes), the controller 15 determines that the driver is gripping the steering wheel 22. In this case, the controller 15 determines whether the capacitance of the capacitive sensor 35 increases to a second threshold TH2 or more (step ST3) after a prescribed time has elapsed from the determination in step ST1. The second threshold TH2 is greater than the first threshold TH1.

In a case where the capacitance of the capacitive sensor 35 is less than the second threshold TH2 (step ST3: No), the controller 15 determines that the driver is gripping the steering wheel 22 normally, and ends the notification giving control without causing the HMI 8 to give the notification to the driver.

In a case where the capacitance of the capacitive sensor 35 increases to the second threshold TH2 or more (step ST3: Yes), the controller 15 determines whether the capacitance of the capacitive sensor 35 falls below the second threshold TH2 (step ST4) after a prescribed time has elapsed from the determination in step ST3.

In a case where the capacitance of the capacitive sensor 35 is the second threshold TH2 or more (step ST4: No), the controller 15 determines that the driver is gripping the steering wheel 22 normally, and ends the notification giving control without causing the HMI 8 to give the notification to the driver.

In a case where the capacitance of the capacitive sensor 35 falls below the second threshold TH2 (step ST4: Yes), the controller 15 determines whether the capacitance of the capacitive sensor 35 falls below the first threshold TH1 (step ST5) after a prescribed time has elapsed from the determination in step ST4.

In a case where the capacitance of the capacitive sensor 35 falls below the first threshold TH1 (step ST5: Yes), the controller 15 determines that the driver is not gripping the steering wheel 22, and causes the HMI 8 to give the first grip prompting notification to the driver (step ST2).

In a case where the capacitance of the capacitive sensor 35 is the first threshold TH1 or more (step ST5: No), the controller 15 determines that the driver is gripping the steering wheel 22 normally or the foreign object is put on the steering wheel 22, and causes the HMI 8 to give the second grip prompting notification to the driver (step ST6). The contents of the second grip prompting notification are the same as the contents of the first grip prompting notification, so the description thereof will be omitted.

<The Function of the Notification Giving Control>

Next, the function of the notification giving control described above will be described with reference to FIGS. 3A to 3D. Hereinafter, "step(s)" refer to step(s) in the notification giving control described above.

Figure 3A:
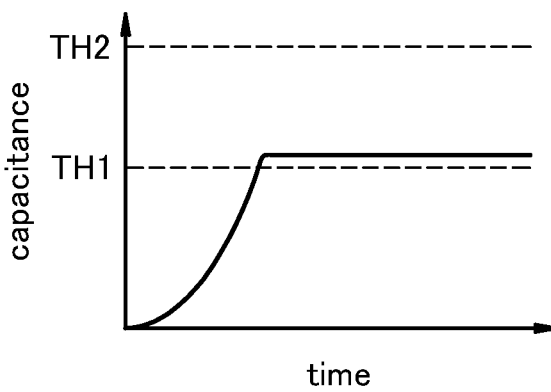
FIGS. 3A to 3D are graphs each illustrating the change in the capacitance of a capacitive sensor according to the first embodiment of the present invention.

FIG. 3A illustrates the change in the capacitance of the capacitive sensor 35 in a case where only the driver's hand approaches the steering wheel 22 and remains at the position of the steering wheel 22 (for example, in a case where the driver grips the steering wheel 22 normally). In this case, as only the driver's hand approaches the steering wheel 22, the capacitance of the capacitive sensor 35 increases to exceed the first threshold TH1 and then settles down to a value below the second threshold TH2. Accordingly, the determination in step ST1 becomes "Yes", and the determination in step ST3 becomes "No". Accordingly, the HMI 8 does not give the notification to the driver.

Figure 3B:
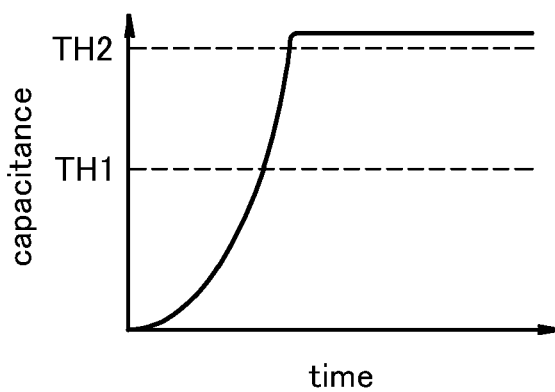

FIG. 3B illustrates the change in the capacitance of the capacitive sensor 35 in a case where both the driver's hand and the foreign object (for example, a wet towel) approach the steering wheel 22 and remain at the position of the steering wheel 22 (for example, in a case where the foreign object gets caught on the steering wheel 22 when the driver grips the steering wheel 22). In this case, as both the driver's hand and the foreign object approach the steering wheel 22, the capacitance of the capacitive sensor 35 increases to the second threshold TH2 or more and then settles down to a value equal to or more than the second threshold TH2. Accordingly, the determinations in steps ST1 and ST3 become "Yes", and the determination in step ST4 becomes "No". Accordingly, the HMI 8 does not give the notification to the driver.

Figure 3C:
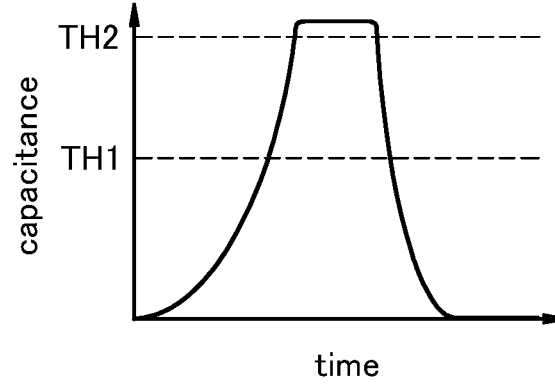

FIG. 3C illustrates the change in the capacitance of the capacitive sensor 35 in a case where both the driver's hand and the foreign object move away from the steering wheel 22 after approaching the steering wheel 22 (for example, in a case where the driver wipes the steering wheel 22 with a wet towel). In this case, as both the driver's hand and the foreign object approach the steering wheel 22, the capacitance of the capacitive sensor 35 increases to the second threshold TH2 or more. Thereafter, as both the driver's hand and the foreign object move away from the steering wheel 22, the capacitance of the capacitive sensor 35 falls below the first threshold TH1. Accordingly, the determinations in steps ST1 and ST3 to ST5 become "Yes". Accordingly, the HMI 8 gives the first grip prompting notification to the driver.

Figure 3D:
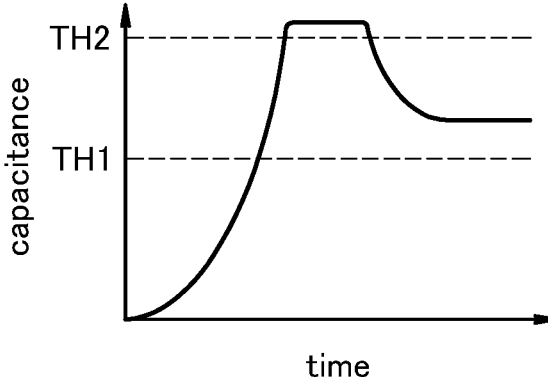

FIG. 3D illustrates the change in the capacitance of the capacitive sensor 35 in a case where either the driver's hand or the foreign object moves away from the steering wheel 22 after both the driver's hand and the foreign object approach the steering wheel 22 (for example, in a case where the foreign object is put on the steering wheel 22). In this case, as both the driver's hand and the foreign object approach the steering wheel 22, the capacitance of the capacitive sensor 35 increases to the second threshold TH2 or more. Thereafter, as either the driver's hand or the foreign object moves away from the steering wheel 22, the capacitance of the capacitive sensor 35 falls below the second threshold TH2 and then settles down to a value equal to more than the first threshold TH1. Accordingly, the determinations in steps ST1, ST3, and ST4 become "Yes", and the determination in step ST5 becomes "No". Accordingly, the HMI 8 gives the second grip prompting notification to the driver.

Accordingly, the HMI 8 gives the second grip prompting notification to the driver in a case where the capacitance of the capacitive sensor 35 decreases after increasing to exceed the first threshold TH1 and then remains at the first threshold TH1 or more. Thus, in a case where the foreign object is put on the steering wheel 22, it is possible to properly give the notification to the occupant (driver).

<The Notification End Control>

Figure 4:
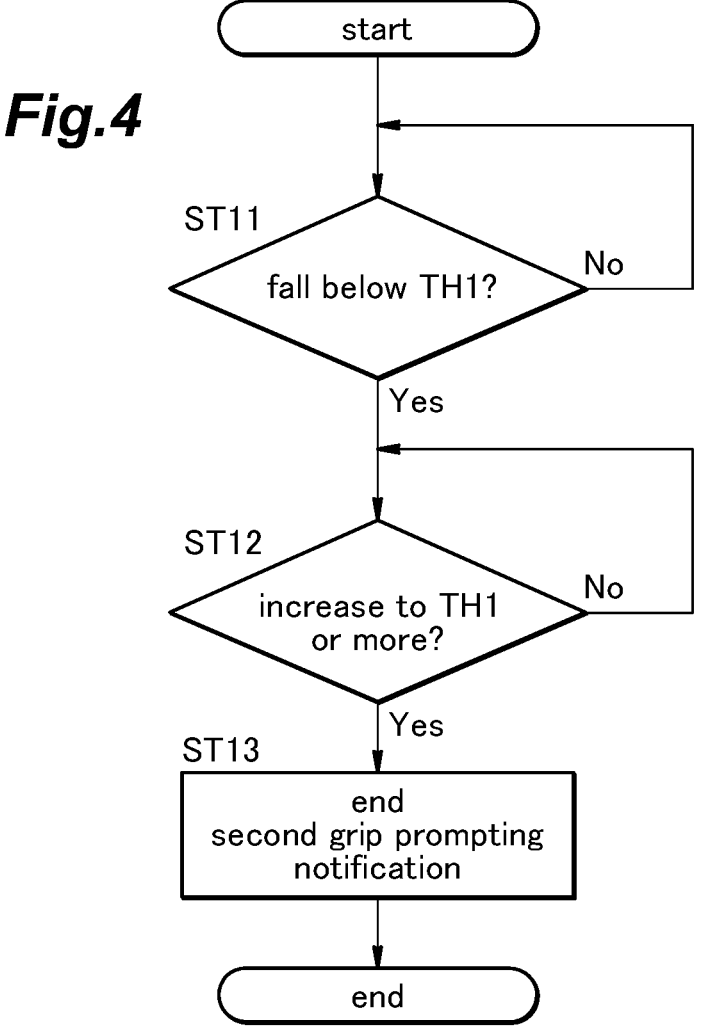
FIG. 4 is a flowchart showing notification end control according to the first embodiment of the present invention.

Next, notification end control for ending the above-mentioned second grip prompting notification will be described with reference to FIG. 4. In the following, it is assumed that the second grip prompting notification is being given to the driver at the start of the notification end control.

First, the controller 15 determines whether the capacitance of the capacitive sensor 35 falls below the first threshold TH1 (step ST11) after a prescribed time has elapsed from the start of the notification end control.

In a case where the capacitance of the capacitive sensor 35 is the first threshold TH1 or more (step ST11: No), the controller 15 repeats the determination in step ST11 while continuing the second grip prompting notification.

In a case where the capacitance of the capacitive sensor 35 falls below the first threshold TH1 (step ST11: Yes), the controller 15 determines whether the capacitance of the capacitive sensor 35 increases to the first threshold TH1 or more (step ST12) after a prescribed time has elapsed from the determination in step ST11.

In a case where the capacitance of the capacitive sensor 35 is less than the first threshold TH1 (step ST12: No), the controller 15 determines that the driver is not gripping the steering wheel 22, and repeats the determination in step ST12 while continuing the second grip prompting notification.

In a case where the capacitance of the capacitive sensor 35 increases to the first threshold TH1 or more (step ST12: Yes), the controller 15 determines that the driver is gripping the steering wheel 22, and ends the second grip prompting notification (step ST13).

<The Update of the First Threshold TH1>

The controller 15 updates the first threshold TH1 based on the capacitance of the capacitive sensor 35 at the time when the controller 15 determines that the driver is gripping the steering wheel 22 normally. For example, the controller 15 updates the first threshold TH1 such that the first threshold TH1 is smaller by a certain value than the capacitance of the capacitive sensor 35 at the time when the controller 15 determines that the driver is gripping the steering wheel 22 normally.

Accordingly, in a case where the capacitance of the capacitive sensor 35 is relatively large at the time when the controller 15 determines that the driver is gripping the steering wheel 22 normally (for example, in a case where the driver's hand contains much moisture), the first threshold TH1 also becomes relatively large. In contrast, in a case where the capacitance of the capacitive sensor 35 is relatively small at the time when the controller 15 determines that the driver is gripping the steering wheel 22 normally (for example, in a case where the driver's hand does not contain much moisture), the first threshold TH1 also becomes relatively small.

The Second Embodiment

Hereinafter, the second embodiment of the present invention will be described with reference to FIGS. 5, 6A, and 6B. The contents other than the notification giving control executed by the controller 15 are the same as those of the first embodiment, so the explanation thereof will be omitted.

<The Notification Giving Control>

Figure 5:
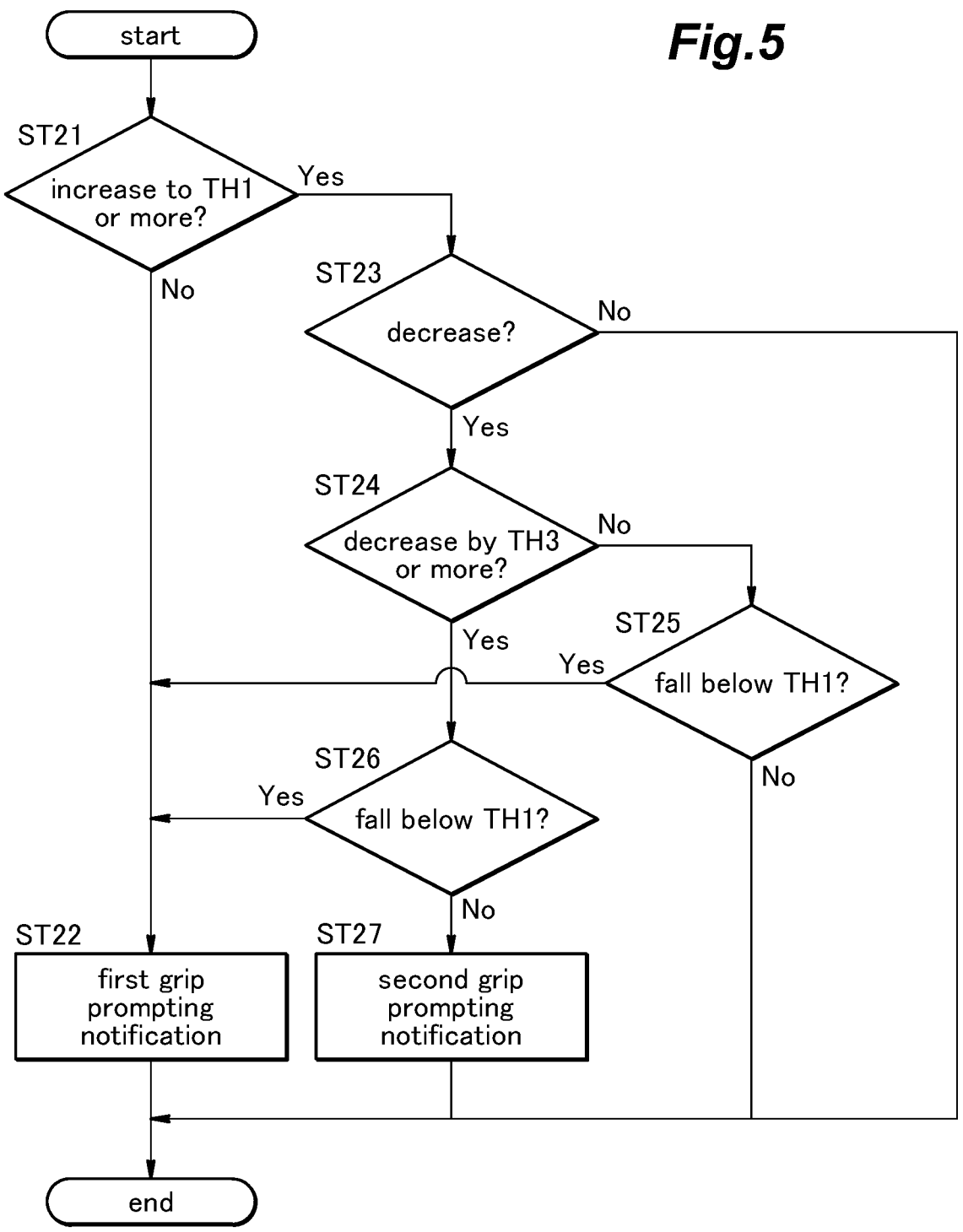
FIG. 5 is a flowchart showing notification giving control according to the second embodiment of the present invention.

With reference to FIG. 5, steps ST21 and ST22 of the notification giving control according to the second embodiment are the same as steps ST1 and ST2 of the notification giving control according to the first embodiment, so the explanation thereof will be omitted.

In a case where the capacitance of the capacitive sensor 35 increases to the first threshold TH1 or more (step ST21: Yes), the controller 15 determines whether the capacitance of the capacitive sensor 35 decreases (step ST23) after a prescribed time has elapsed from the determination in step ST21.

In a case where the capacitance of the capacitive sensor 35 does not decrease (step ST23: No), the controller 15 determines that the driver is gripping the steering wheel 22 normally, and ends the notification giving control without causing the HMI 8 to give the notification to the driver.

In a case where the capacitance of the capacitive sensor 35 decreases (step ST23: Yes), the controller 15 determines whether the capacitance of the capacitive sensor 35 decreases by a third threshold TH3 or more (step ST24) after a prescribed time has elapsed from the determination in step ST23. That is, the controller 15 determines whether the capacitance of the capacitive sensor 35 decreases by the third threshold TH3 or more within the unit time from the start of the decrease thereof.

In a case where the capacitance of the capacitive sensor 35 does not decrease by the third threshold TH3 or more (step ST24: No), the controller 15 determines whether the capacitance of the capacitive sensor 35 falls below the first threshold TH1 (step ST25) after a prescribed time has elapsed from the determination in step ST24.

In a case where the capacitance of the capacitive sensor 35 falls below the first threshold TH1 (step ST25: Yes), the controller 15 determines that the driver is not gripping the steering wheel 22, and causes the HMI 8 to give the first grip prompting notification to the driver (step ST22).

In a case where the capacitance of the capacitive sensor 35 is equal to or more than the first threshold TH1 (step ST25: No), the controller 15 determines that the driver is gripping the steering wheel 22 normally, and ends the notification giving control without causing the HMI 8 to give the notification to the driver.

In a case where the capacitance of the capacitive sensor 35 decreases by the third threshold TH3 or more (step ST24: Yes), the controller 15 determines whether the capacitance of the capacitive sensor 35 falls below the first threshold TH1 (step ST26) after a prescribed time has elapsed from the determination in step ST24.

In a case where the capacitance of the capacitive sensor 35 falls below the first threshold TH1 (step ST26: Yes), the controller 15 determines that the driver is not gripping the steering wheel 22, and causes the HMI 8 to give the first grip prompting notification to the driver (step ST22).

In a case where the capacitance of the capacitive sensor 35 is equal to or more than the first threshold TH1 (step ST26: No), the controller 15 determines that the driver is gripping the steering wheel 22 normally or the foreign object is put on the steering wheel 22, and causes the HMI 8 to give the second grip prompting notification to the driver (step ST27).

<The Function of the Notification Giving Control>

Next, the function of the notification giving control described above will be described with reference to FIGS. 6A and 6B. Hereinafter, "step(s)" refer to step(s) in the notification giving control described above.

Figure 6A:
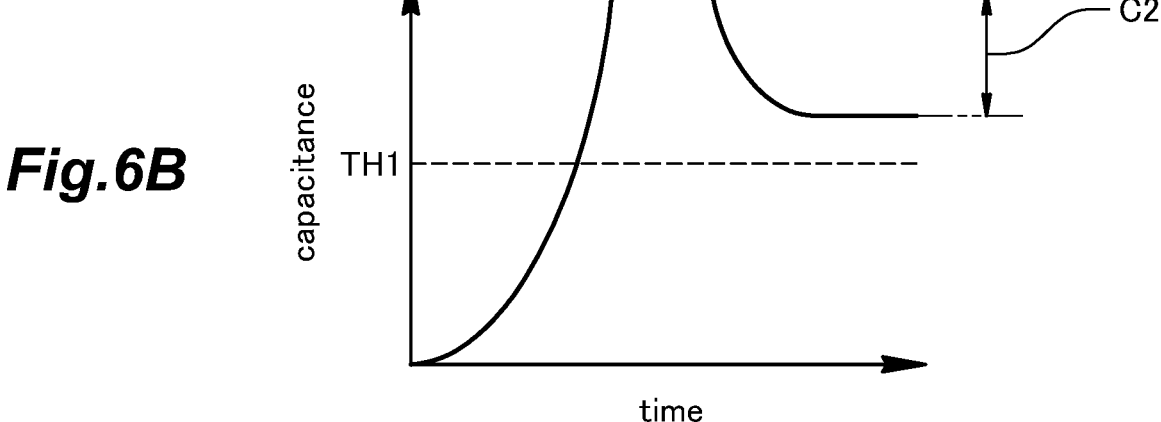

FIG. 6A illustrates the change in the capacitance of the capacitive sensor 35 in a case where the driver weakens his/her grip on the steering wheel 22 after gripping the steering wheel 22. In this case, when the driver grips the steering wheel 22, the capacitance of the capacitive sensor 35 increases to exceed the first threshold TH1. Thereafter, as the driver weakens his/her grip on the steering wheel 22, the capacitance of the capacitive sensor 35 decreases by a first fluctuation C1 (the first fluctuation C1<third threshold TH3) and then settles down to a value equal to more than the first threshold TH1. Accordingly, the determinations in steps ST21 and ST23 become "Yes", and the determinations in steps ST24 and ST25 become "No". Accordingly, the HMI 8 does not give the notification to the driver.

FIG. 6B illustrates the change in the capacitance of the capacitive sensor 35 in a case where either the driver's hand or the foreign object moves away from the steering wheel 22 after both the driver's hand and the foreign object approach the steering wheel 22 (for example, in a case where the foreign object is put on the steering wheel 22). In this case, as both the driver's hand and the foreign object approach the steering wheel 22, the capacitance of the capacitive sensor 35 increases to exceed the first threshold TH1. Thereafter, as either the driver's hand or the foreign object moves away from the steering wheel 22, the capacitance of the capacitive sensor 35 decreases by a second fluctuation C2 (the second fluctuation C2≥the third threshold TH3) and then settles down to a value equal to more than the first threshold TH1. Accordingly, the determinations in steps ST21, ST23, and ST24 become "Yes", and the determination in step ST26 becomes "No". Accordingly, the HMI 8 gives the second grip prompting notification to the driver.

Accordingly, the HMI 8 gives the second grip prompting notification to the driver in a case where the capacitance of the capacitive sensor 35 decreases by the third threshold TH3 or more after increasing to exceed the first threshold TH1 and then remains at the first threshold TH1 or more.

Thus, in a case where the foreign object is put on the steering wheel 22, it is possible to properly give the notification to the occupant (driver).

The Third Embodiment

Hereinafter, the third embodiment of the present invention will be described with reference to FIGS. 7, 8A, and 8B. The contents other than the notification giving control executed by the controller 15 are the same as those of the first embodiment, so the explanation thereof will be omitted.

<The Notification Giving Control>

Figure 7:
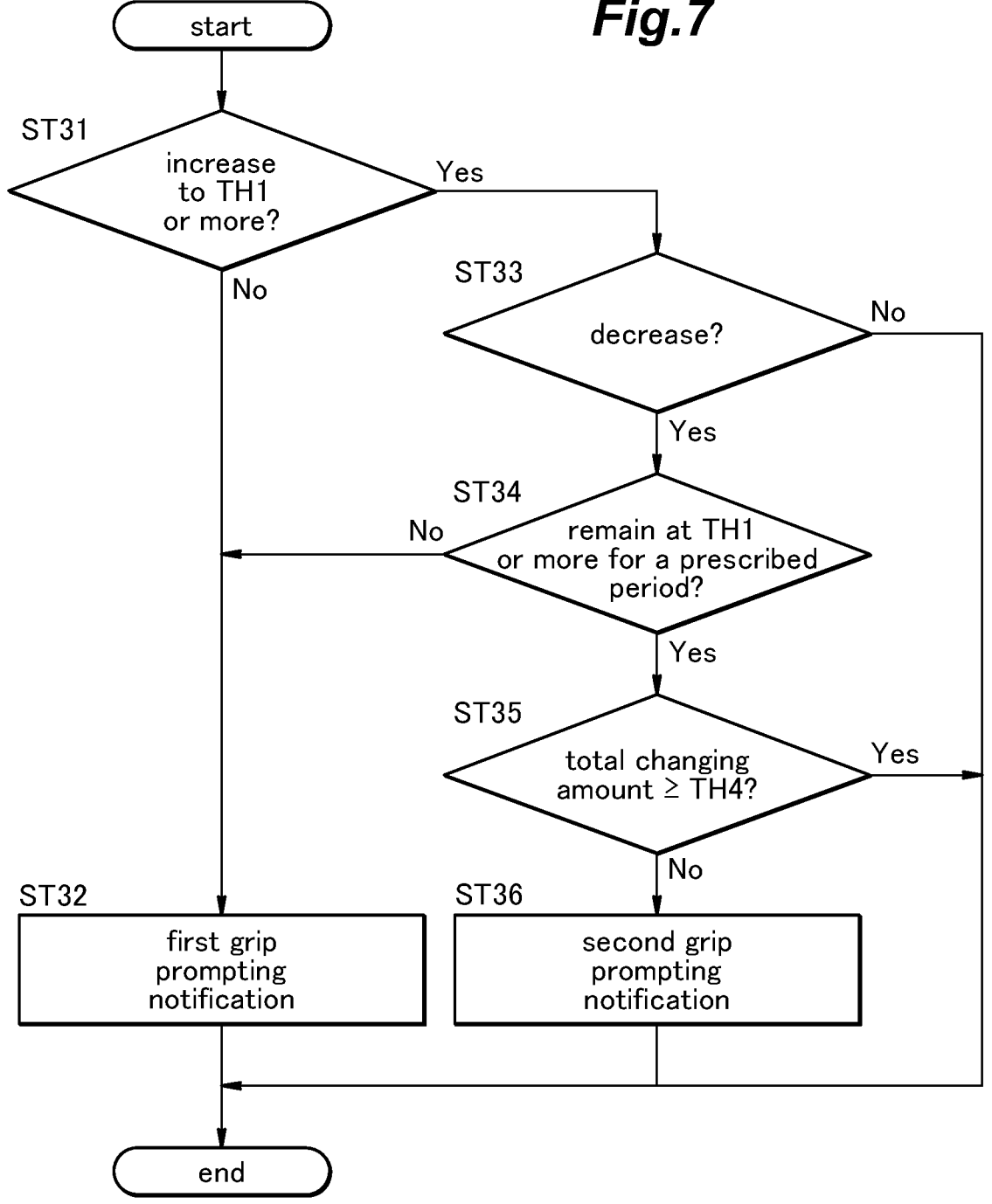
FIG. 7 is a flowchart showing notification giving control according to the third embodiment of the present invention.

With reference to FIG. 7, steps ST31 to ST33 of the notification giving control according to the third embodiment are the same as steps ST21 to ST23 of the notification giving control according to the second embodiment, so the explanation thereof will be omitted.

In a case where the capacitance of the capacitive sensor 35 decreases (step ST33: Yes), the controller 15 determines whether the capacitance of the capacitive sensor 35 remains at the first threshold TH1 or more for a prescribed period X (step ST34) after a prescribed time has elapsed from the determination in step ST33.

In a case where the capacitance of the capacitive sensor 35 does not remain at the first threshold TH1 or more for the prescribed period X (step ST34: No), the controller 15 determines that the driver is not gripping the steering wheel 22, and causes the HMI 8 to give the first grip prompting notification to the driver (step ST32).

In a case where the capacitance of the capacitive sensor 35 remains at the first threshold TH1 or more for the prescribed period X (step ST34: Yes), the controller 15 calculates a total changing amount of the capacitance of the capacitive sensor 35 in the prescribed period X (hereinafter, simply referred to as "total changing amount"), and determines whether the total changing amount is a fourth threshold TH4 or more (step ST35).

In a case where the total changing amount is the fourth threshold TH4 or more (step ST35: Yes), the controller 15 determines that the driver is gripping the steering wheel 22 normally, and ends the notification giving control without causing the HMI 8 to give the notification to the driver.

In a case where the total changing amount is less than the fourth threshold TH4 (step ST35: No), the controller 15 determines that the foreign object is put on the steering wheel 22, and causes the HMI 8 to give the second grip prompting notification to the driver (step ST36).

<The Function of the Notification Giving Control>

Next, the function of the notification giving control described above will be described with reference to FIGS. 8A and 8B. Hereinafter, "step(s)" refer to step(s) in the notification giving control described above.

Figure 8A:
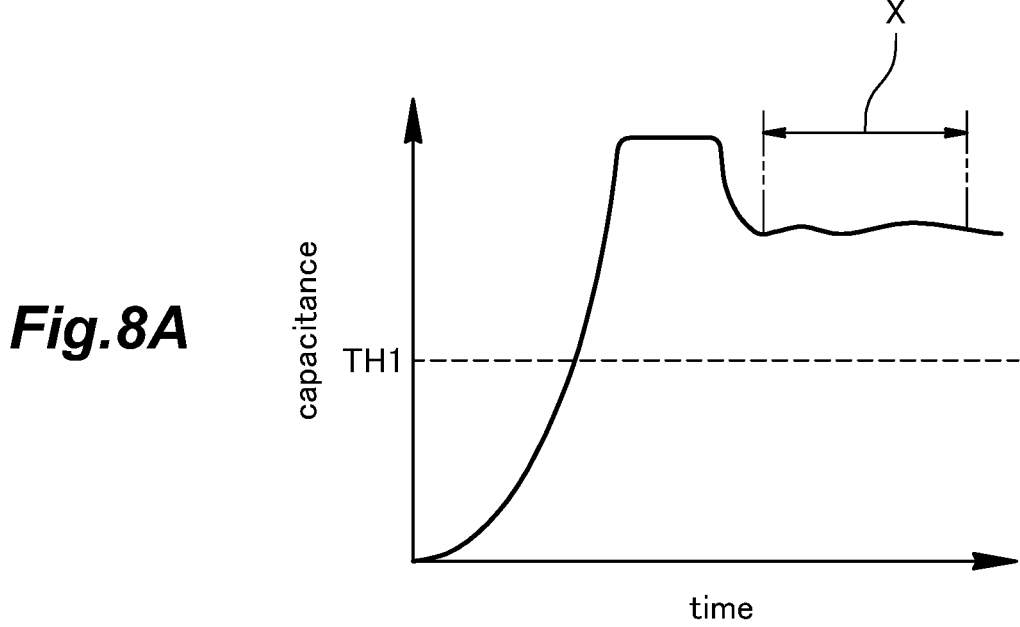
FIGS. 8A and 8B are graphs each illustrating the change in the capacitance of a capacitive sensor according to the third embodiment of the present invention.

FIG. 8A illustrates the change in the capacitance of the capacitive sensor 35 in a case where the driver weakens his/her grip on the steering wheel 22 after gripping the steering wheel 22. In this case, as the driver grips the steering wheel 22, the capacitance of the capacitive sensor 35 increases to exceed the first threshold TH1. Thereafter, as the driver weakens his/her grip on the steering wheel 22, the capacitance of the capacitive sensor 35 decreases and then settles down to a value equal to more than the first threshold TH1. Accordingly, the capacitance of the capacitive sensor 35 remains at the first threshold TH1 or more for the prescribed period X. Further, as the driver grips the steering wheel 22 again or changes the hand to grip the steering wheel 22, the capacitance of the capacitive sensor 35 slightly increases or decreases. Accordingly, the total changing amount becomes the fourth threshold TH4 or more. Accordingly, the determinations in steps ST31 and ST33 to ST35 become "Yes". Accordingly, the HMI 8 does not give the notification to the driver.

Figure 8B:
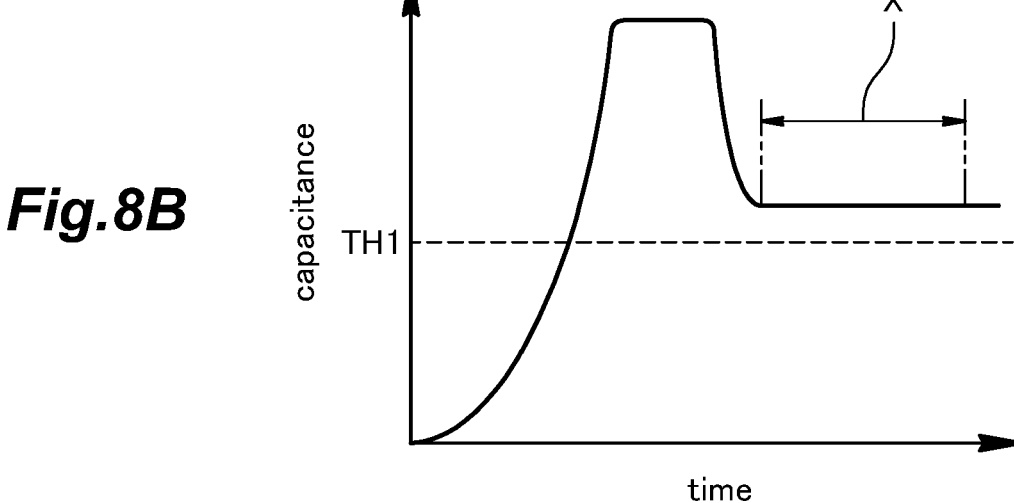

FIG. 8B illustrates the change in the capacitance of the capacitive sensor 35 in a case where the foreign object is put on the steering wheel 22. In this case, as both the driver's hand and the foreign object approach the steering wheel 22, the capacitance of the capacitive sensor 35 increases to exceed the first threshold TH1. Thereafter, as the driver's hand moves away from the steering wheel 22, the capacitance of the capacitive sensor 35 decreases and then settles down to a value equal to or more than the first threshold TH1. Accordingly, the capacitance of the capacitive sensor 35 remains at the first threshold TH1 or more for the prescribed period X. Further, in a state where the foreign object is put on the steering wheel 22, the position of the foreign object does not change. Accordingly, the total changing amount is less than the fourth threshold TH4. Accordingly, the determinations in steps ST31, ST33, and ST34 become "Yes", and the determination in step ST35 becomes "No". Accordingly, the HMI 8 gives the second grip prompting notification to the driver.

Accordingly, the HMI 8 gives the second grip prompting notification in a case where the capacitance of the capacitive sensor 35 decreases after increasing to exceed the first threshold TH1 and then remains at the first threshold TH1 or more for the prescribed period X, and the total changing amount is less than the fourth threshold TH4. Thus, in a case where the foreign object is put on the steering wheel 22, it is possible to properly give the notification to the occupant (driver).

The Modified Embodiments

In the first embodiment described above, the contents of the second grip prompting notification (step ST6) are the same as the contents of the first grip prompting notification (step ST2). In another embodiment, the contents of the second grip prompting notification may be different from the contents of the first grip prompting notification. The first grip prompting notification is a notification at the time when the controller 15 determines that the driver is not gripping the steering wheel 22. In contrast, the second grip prompting notification is a notification at the time when the controller 15 determines that the driver is gripping the steering wheel 22 normally or the foreign object is put on the steering wheel 22. Accordingly, the first grip prompting notification may include a message that directly instructs the driver to grip the steering wheel 22, while the second grip prompting notification may include a message that asks the driver whether he/she is gripping the steering wheel 22.

In the third embodiment described above, in a case where the capacitance of the capacitive sensor 35 remains at the first threshold TH1 or more for the prescribed period X (step ST34: Yes), the controller 15 determines whether the total changing amount is the fourth threshold TH4 or more (step ST35). In another embodiment, in a case where the capacitance of the capacitive sensor 35 remains at the first threshold TH1 or more for the prescribed period X (step ST34: Yes), the controller 15 may cause the HMI 8 to give the second grip prompting notification to the driver without making the determination in step ST35.

In the first to third embodiments described above, the present invention is used in a situation where the foreign object (for example, a wet towel) is put on the steering wheel 22. In another embodiment, the present invention may be used not only in a situation where the foreign object is put on the steering wheel 22 but also in a situation where moisture (for example, the occupant's drink) adheres to the steering wheel 22.

In the first to third embodiments described above, the steering wheel 22 is used as the steering operation member. In another embodiment, an operation member (for example, control stick) other than the steering wheel 22 may be used as the steering operation member.

Concrete embodiments of the present invention have been described in the foregoing, but the present invention should not be limited by the foregoing embodiments and various modifications and alterations are possible within the scope of the present invention.

The invention claimed is:

1. A vehicle steering system, comprising:
a steering operation member configured to receive a steering operation of a vehicle by a driver;
a capacitive sensor provided in the steering operation member and configured such that capacitance of the capacitive sensor changes as the driver grips the steering operation member;
a controller configured to determine that the driver is gripping the steering operation member in a case where the capacitance of the capacitive sensor is equal to or more than a first threshold and determine that the driver is not gripping the steering operation member in a case where the capacitance of the capacitive sensor is less than the first threshold; and
a notification device configured to give a notification to the driver in a case where the controller determines that the driver is not gripping the steering operation member,
wherein the controller is configured to:
determine whether the capacitance of the capacitive sensor increases to the first threshold or more;
determine whether the capacitance of the capacitive sensor decreases in a case where the capacitance of the capacitive sensor increases to the first threshold or more;
determine whether the capacitance of the capacitive sensor remains at the first threshold or more in a case where the capacitance of the capacitive sensor decreases; and
cause the notification device to give the notification to the driver in a case where the capacitance of the capacitive sensor remains at the first threshold or more.

2. The vehicle steering system according to claim 1, wherein the controller is configured to cause the notification device to give the notification to the driver in a case where the capacitance of the capacitive sensor falls below a second threshold after increasing to the second threshold or more and then remains at the first threshold or more, the second threshold being greater than the first threshold.

3. The vehicle steering system according to claim 1, wherein the controller is configured to cause the notification device to give the notification to the driver in a case where the capacitance of the capacitive sensor decreases by a third threshold or more after increasing to exceed the first threshold and then remains at the first threshold or more.

4. The vehicle steering system according to claim 1, wherein the controller is configured to cause the notification device to give the notification to the driver in a case where the capacitance of the capacitive sensor decreases after increasing to exceed the first threshold and then remains at the first threshold or more for a prescribed period.

5. The vehicle steering system according to claim 1, wherein the controller is configured to cause the notification device to give the notification to the driver in a case where the capacitance of the capacitive sensor decreases after increasing to exceed the first threshold and then remains at the first threshold or more for a prescribed period, and a total changing amount of the capacitance of the capacitive sensor in the prescribed period is less than a fourth threshold.

6. The vehicle steering system according to claim 1, wherein the controller is configured not to cause the notification device to give the notification to the driver in a case where the capacitance of the capacitive sensor decreases after increasing to exceed the first threshold and then remains at the first threshold or more for a prescribed period, and a total changing amount of the capacitance of the capacitive sensor in the prescribed period is a fourth threshold or more.

7. The vehicle steering system according to claim 1, wherein the controller is configured to cause the notification device to give the notification that prompts the driver to grip the steering operation member in a case where the capacitance of the capacitive sensor decreases after increasing to exceed the first threshold and then remains at the first threshold or more.

8. The vehicle steering system according to claim 7, wherein the controller is configured to cause the notification device to end the notification that prompts the driver to grip the steering operation member in a case where the capacitance of the capacitive sensor falls below the first threshold and then increases to the first threshold or more after starting the notification that prompts the driver to grip the steering operation member.

9. The vehicle steering system according to claim 1, wherein the controller is configured to update the first threshold based on the capacitance of the capacitive sensor at a time when the controller determines that the driver is gripping the steering operation member.

* * * * *